(12) United States Patent
Litwin, Jr. et al.

(10) Patent No.: US 7,020,826 B2
(45) Date of Patent: Mar. 28, 2006

(54) INTRA-DECODER COMPONENT BLOCK MESSAGING

(75) Inventors: Louis Robert Litwin, Jr., Plainsboro, NJ (US); Didier Velez, Carmel, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 511 days.

(21) Appl. No.: 10/055,114

(22) Filed: Jan. 23, 2002

(65) Prior Publication Data

US 2003/0140301 A1    Jul. 24, 2003

(51) Int. Cl.
*H03M 13/00* (2006.01)

(52) U.S. Cl. .................. 714/784; 714/756; 714/785

(58) Field of Classification Search ........... 714/752, 714/755, 758, 780, 781, 782, 783, 784, 785, 714/786, 787
See application file for complete search history.

(56) References Cited

U.S. PATENT DOCUMENTS

| | | | |
|---|---|---|---|
| 4,875,211 A | 10/1989 | Murai et al. ............... 714/784 |
| 5,099,482 A * | 3/1992 | Cameron .................... 714/784 |
| 5,373,511 A | 12/1994 | Veksler ...................... 714/755 |
| 5,712,861 A | 1/1998 | Inoue et al. |
| 5,905,740 A * | 5/1999 | Williamson ................ 714/784 |
| 6,058,500 A | 5/2000 | DesJardins et al. ........ 714/781 |
| 6,061,826 A | 5/2000 | Thirumoorthy et al. .... 714/784 |
| 6,065,149 A | 5/2000 | Yamanaka .................. 714/780 |
| 6,175,945 B1 | 1/2001 | Okita .......................... 714/784 |
| 6,195,781 B1 | 2/2001 | Kosuge ...................... 714/784 |
| 6,345,376 B1 * | 2/2002 | Cox et al. .................. 714/785 |
| 6,347,389 B1 * | 2/2002 | Boyer ......................... 714/784 |
| 6,374,383 B1 | 4/2002 | Weng .......................... 714/781 |
| 6,415,413 B1 * | 7/2002 | Pan et al. ................... 714/784 |
| 6,487,692 B1 * | 11/2002 | Morelos-Zaragoza ...... 714/784 |
| 6,735,737 B1 * | 5/2004 | Sankaran et al. .......... 714/782 |

FOREIGN PATENT DOCUMENTS

| | | |
|---|---|---|
| EP | 0509430 A1 | 10/1992 |
| EP | 0660535 A2 | 6/1995 |

OTHER PUBLICATIONS

PCT Search Report dated: Apr. 15, 2003.

(Continued)

*Primary Examiner*—Guy J. Lamarre
(74) *Attorney, Agent, or Firm*—Joseph J. Laks; Ronald H. Kurdyla; Guy H. Eriksen

(57) ABSTRACT

A decoder and decoding method are described, in which a syndrome is calculated from a codeword in a syndrome generator, an error polynomial is generated based upon the syndrome in an error polynomial generator, an error location is determined from the error polynomial in the error location generator, an error magnitude is calculated from the error polynomial in the error magnitude generator and the codeword is corrected by a error corrected codeword generator responsive to location and error magnitude. An intra-decoder block messaging scheme is described in which one or more components generate inactivity messages to signal an ability to process data corresponding to a next codeword. A dual Chien search block implementation is described in which Chien block is used to determine the number of errors corresponding to a specified codeword, separately from error location and magnitude calculations performed by the Chien/Forney block. An enhanced Chien search cell architecture is described which utilizes an additional Galois field adder to synchronize the codeword and error vector, thereby decreasing delay and expense corresponding to an error correcting block implemented with a LIFO register.

20 Claims, 8 Drawing Sheets

OTHER PUBLICATIONS

"Quantum Reed—Solomon Codes", Markus Grassl, Willi Geiselmann, and Thomas Beth, Institut für Algorithmen und Kognitive Systeme, Arbeitsgruppe Quantum Computing, Universität Karlsruhe, Am Fasanengarten 5, 76 128 Karlsruhe, Germany, pp. 1-14.

"Optimal Finite Field Multipliers for FPGAs", Captain Gregory C. Ahlquist, Brent Nelson, and Michael Rice, article found at http://splish.ee.byu.edu/docs/ffmult.fp199.pdf—Similar pp., Mar. 1, 2001, 10 pages.

"Tutorial on Reed-Solomon Error Correction Coding", William A. Geisel, NASA Technical Memorandum 102162, Aug. 1990, pp. 72-74.

"Error Control Systems for Digital Communication and Storage", Stephen B. Wicker, Library of Congress Cataloging-in-Publication Data, p. 209.

"Parallel Decoder for Cellular Automata Based Byte Error Correcting Code", S. Chattopadhyay and P. Pal Chaudhuri, 10th International Conference on VLSI Design, Jan. 1997, pp. 527-528.

"Designing a Reed-Solomon Codec in an ADSL System using a C6201 DSP", by Han Kuo, article found, at http://www.csdmag.com/news/des0111011.htm, Mar. 9, 2001, 10 pages.

"A Faster Way To Run Reed Solomon Decoders", Torjell Berg and Aaron Brennan, American Microsystems Inc., Article found at http://www.eetasia.com/article_content.php3?article_id=8800067078 Mar. 9, 2001; posted: Jan. 1, 2001, 3 pages.

"XF-RSDEC Reed Solomon Decoder", article found at http://www.xilinx.com/products/logicore/alliance/memec/xf_rsdec.pdf, Jan. 10, 2000, pp. 3-1-3-5.

"Reed-Solomon Codes—'An introduction to Reed-Solomon codes: principles, architecture and implementation'", article found at http://www.4i2i.com/reed_solomon_codes.htm, Mar. 9, 2001, 8 pages.

"Reed Solomon Decoder: TMS320C64x Implementation, 'Digital Signal Processing Solutions'", Jagadeesh Sankaran, Texas Instruments Application Report SPRA686—Dec. 2000, pp. 1-20, 31, 38, 49, 60, 67-70.

Iwaki, et al., Architecture of a High Speed Reed-Solomon Decoder, 8087 IEEE Transaction on Consumer Electronics, XP000441786, Jan. 14, 1994, pp. 75-81.

Kamada, et al., An Area Effective Standard Cell Based Channel Decoder LSI for Digital Satellite TV Broadcasting, XP-002349513, 1996, IEEE, pp. 337-346.

Tehranchi, et al., Reliability Estimates for Data Recovered from Compact Discs, Applied Optics, vol. 37, No. 2, Jan. 10, 1988, pp. 386-395.

* cited by examiner

US 7,020,826 B2

INTRA-DECODER COMPONENT BLOCK MESSAGING

This patent application is related to simultaneously filed U.S. patent application Ser. No. 10/055,076, filed Jan. 23, 2002 entitled DUAL CHIEN SEARCH BLOCKS IN AN ERROR-CORRECTING DECODER; and U.S. patent application Ser. No. 10/055,470, filed Jan. 23, 2002 entitled CHIEN SEARCH CELL FOR AN ERROR-CORRECTING DECODER, both of which are incorporated herein by reference in their entireties.

FIELD OF THE INVENTION

The present invention relates to digital communication system error detection and correction.

BACKGROUND OF THE INVENTION

An important function of any modern digital communications system is error control coding. Error control coding is the field of communications that deals with techniques for detecting and correcting errors in a digital system. Generally, error detecting/correcting schemes are utilized whenever it is desired to ensure that, during transmission or through storage of digital data, error is not introduced into the data, or in the alternative, if error is introduced into the data, that the introduced error is corrected. The ability to detect and/or correct data errors is accomplished by adding redundancy to the data. The inclusion of redundant bits in transmitted or stored data results in a coded signal or field comprised of more bits than the original uncoded signal or field.

One frequently used scheme for error detection/correction is through the use of so-called Reed-Solomon codes. Reed-Solomon codes are non-binary systematic cyclic linear block codes. Non-binary codes work with symbols that are comprised of several bits. Non-binary code, such as the Reed-Solomon code, are good at correcting burst errors because the correction by these codes is done on the symbol level. A systematic code, such as the Reed-Solomon code, generates codewords that contain the message symbols in unaltered form. The encoder applies a reversible mathematical function to the message symbols in order to generate the redundancy, or parity, symbols. The codeword is then formed by appending the parity symbols to the message symbols. The Reed-Solomon code is considered a cyclical code because a circular shift of any valid codeword also produces another valid codeword. Cyclic codes are popular because there exist efficient and inexpensive decoding techniques to implement them. Finally, the Reed-Solomon code is considered linear because the addition of any two valid codewords results in another valid codeword.

A typical Reed-Solomon decoder is comprised of the following major component blocks: (i) a syndrome generating block, (ii) an error polynomial block, (iii) an error location block, and (iv) an error magnitude block, (v) an error correcting block, and (vi) a delay block. The syndrome generating block is used to receive a codeword and generate a syndrome from the codeword. The syndrome is utilized to create an error polynomial in the error polynomial block. The error polynomial is passed onto the error location and error magnitude blocks, in which error locations and magnitudes for a codeword are respectively determined. An error vector is generated from the error location and magnitude. A delayed version of the received codeword is corrected by the error correcting block using the error vector corresponding to a specific codeword. The delay block is comprised of a memory to store the received codeword while the decoding process is performed to produce the error vector.

Prior art decoders use these blocks to form a "delivery pipeline." That is, the input to one block only depends on the output of a previous block and there is no feedback from one component block to a previous or subsequent block. Therefore, only one codeword at a time may be processed, and the next codeword to be processed isn't begun until the processing of the previous codeword is completed.

SUMMARY OF THE INVENTION

The inefficiencies of the prior art are overcome in the present invention, a method and apparatus for performing data error detection within a codeword. A decoder performing the data error detection is comprised of a syndrome generator for calculating a syndrome from the codeword; an error polynomial generator for generating an error polynomial from the syndrome; an error location generator for determining an error location from the error polynomial; and an error magnitude generator for calculating an error magnitude from the error polynomial. The decoder is characterized in that it is adapted to send an intra-decoder inactivity message from at least one component selected from a group comprising the syndrome generator, the error polynomial generator, the error location generator, and the error magnitude generator.

BRIEF DESCRIPTION OF THE DRAWINGS

Reference to the following description of the present invention should be taken in conjunction with the accompanying drawings, wherein.

decoder in which memory requirements and delay are both reduced, in accordance with the principles of the present invention.

DETAILED DESCRIPTION OF THE INVENTION

Figure 1:
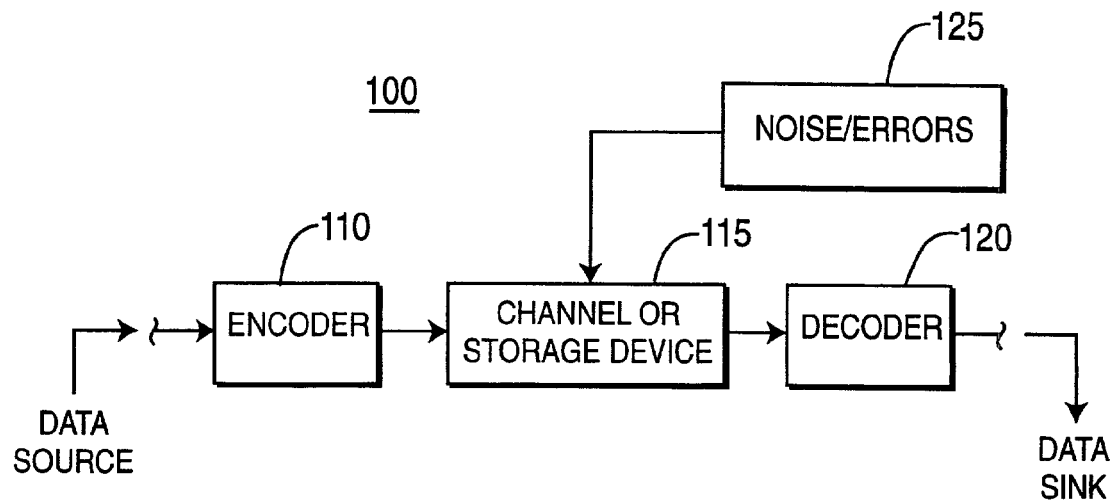
FIG. 1 is a block diagram representation of a digital data delivery system incorporating an error correcting scheme.

With reference to FIG. 1, there is depicted a block diagram representation of a digital data delivery system 100 incorporating an error detecting/correcting scheme, in accordance with the principles embodied in the present invention. Generally, error detecting/correcting schemes are utilized whenever it is desired to ensure that, during transmission or through storage of digital data, error is not introduced into the data, or in the alternative, if error is introduced into the data, that the introduced error is corrected. The ability to detect and/or correct data errors is accomplished by adding redundancy to the data. The inclusion of redundant bits in transmitted or stored data results in a coded signal or field comprised of more bits than the original uncoded signal or field. The quid pro quo for tolerating this additional overhead is the ability to detect, or to detect and correct, errors. The performance improvement gained using error control coding is often measured in terms of coding gain. Suppose an uncoded communications system achieves a given bit error rate (BER) at a signal-to-noise ratio (SNR) of 30 dB. If an error control coding scheme with a coding gain of 3 dB were added to the system, the coded system would be able to achieve the BER at the even lower SNR of 27 dB. Alternatively, if the system was operated at a SNR of 30 dB, the BER achieved by the coded system would be the same BER that the uncoded system achieved at an SNR of 33 dB. The power of the coding gain is that it allows a communications system to either (i) maintain a desired BER at a lower SNR than was possible without coding, or (ii) achieve a higher BER than an uncoded system could attain at a given SNR.

By way of example, it is the function of the encoder 110 to accept digital data from the data source and transmit the data via a channel or store the data in a storage medium (shown collectively as a channel or storage device 115) or otherwise manipulate or process the data. It is often the case that, during the process of transmission or storage, data may be introduced to noise or error 125, thus becoming corrupted or altered in form from the original digital data. Decoder 120 functions to detect and correct, or in the alternative merely to detect, whether or not a prescribed portion of the digital data has become corrupted.

Figure 2:
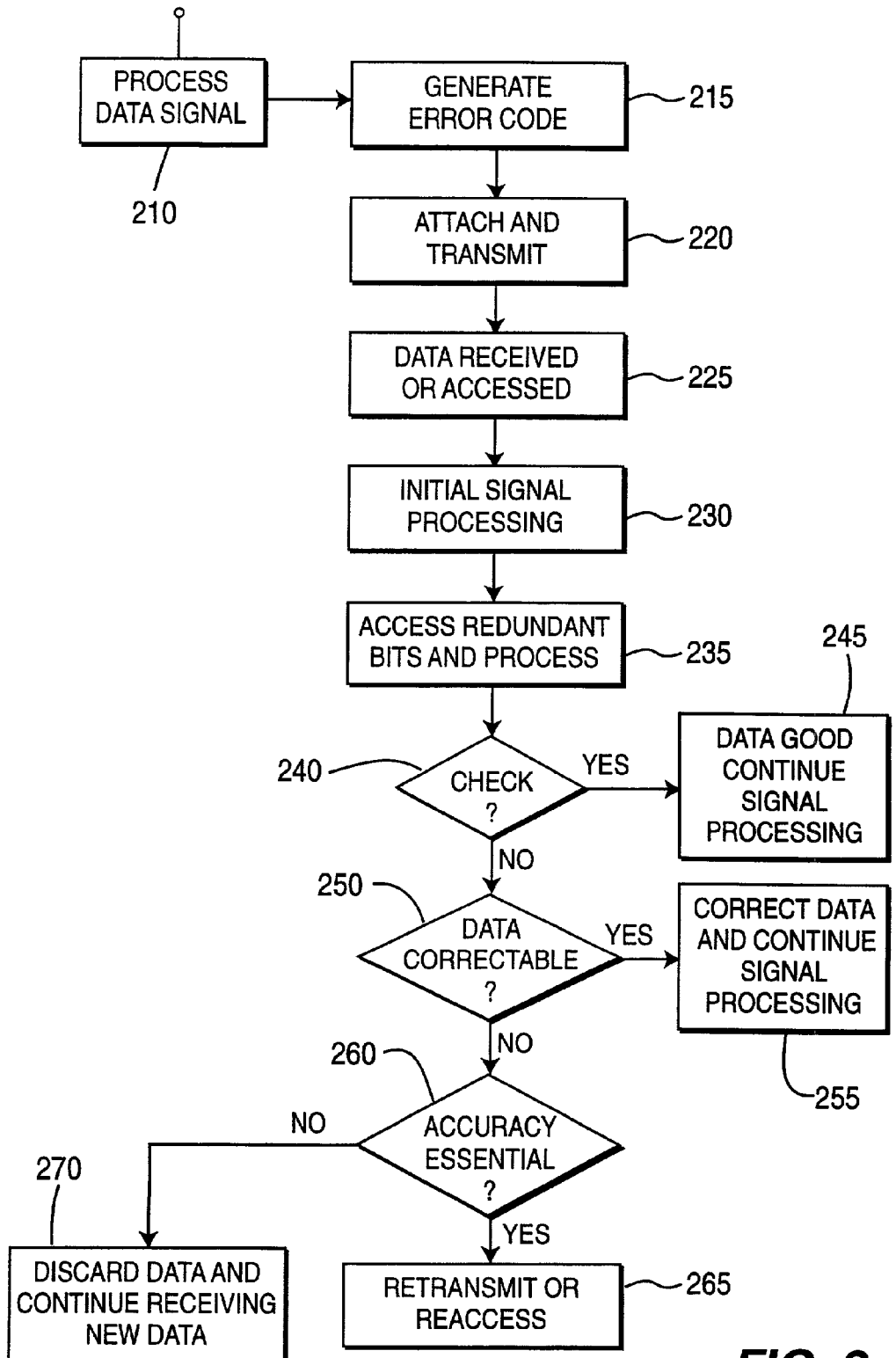
FIG. 2 is a flow chart illustrating a typical error correcting scheme methodology.

With reference to FIG. 2, there is depicted a flow chart illustrating the various error detecting/correcting processes available within the context of a transmitter/channel/receiver environment. Although described in such a context, it would be apparent to those skilled in the art that such error detecting/correcting processes would also apply equally to broadcast transmission, digital data storage, or any other process in which digital data (whether in the form of a data field, packet, stream, etc.) is processed or manipulated. By way of example, merely illustrative and not meant to be exhaustive or exclusive, the following technologies/devices may utilize error detection/correction schemes to improve performance, integrity, and reliability: (i) various storage devices, including but not limited to tape, compact disc (CD), digital versatile disc (DVD), barcodes, etc., (ii) wireless or mobile communications (including cellular telephones, two way transceivers, microwave links, etc., (iii) satellite communications, (iv) digital radio, digital television (DTV), digital video broadcasting (DVB), etc., (v) modems, including but not limited to cable, V.pcm, ADSL, xDSL, etc.

In accordance with step 210, after initially establishing a link and negotiating transmission channel parameters, a transmitting source processes digital data in a form suitable for transmission. In accordance with step 215, and prior to transmission, the source generates an error code; the error code based at least in part upon the value of the digital data to be transmitted, thus providing a degree of data redundancy. In accordance with step 220, the generated error code is appended, attached, multiplexed, or otherwise included along with the digital data, and transmitted from the transmitter to the receiver. In accordance with step 225, the digital data and the error code are received at the receiver. Initial signal processing, if required, is implemented at the receiver, in accordance with step 230. In accordance with step 235, the receiver accesses the error code's redundant bits and processes the information contained therein according to the error control code scheme being utilized. In accordance with step 240, should the redundant bits processed affirmatively check against the received digital data, then the data is presumed to be uncorrupted. Further signal processing (if any) of the digital data is resumed at the receiver, in accordance with step 245.

Should, however, the redundant bits processed indicate that the received digital data is corrupted (contains at least one bit error), then the data errors are evaluated to determine whether the errors are correctable within the error control scheme being utilized, in accordance with step 250. That is, some error control schemes are only capable of error detection, but do not include the quality and type of redundant data to allow for correction of those errors. Other error control schemes may utilize only their error detecting capabilities despite the fact that they may have both error detecting and correcting capability. Often, this is the scheme utilized when the accuracy of any particular data signal, message, or packet is not of paramount importance, but rather consistent and timely delivery of data is of paramount importance. An example of such an application is synchronous streamed data for voice, audio, and video applications. Additionally, even when an error correcting scheme is utilized to detect and correct errors, if the number or burst of errors detected is greater than the error correcting capability (that is, exceeds the redundant information provided by the error code bits), then the data is simply not recoverable. In accordance with step 255, if the data is correctable, then the data errors are corrected and further signal processing (if any) is resumed at the receiver. If however, the errors are uncorrectable, then an evaluation is performed to determine whether accuracy of the data is essential, in accordance with step 260. If data accuracy is essential, as would be in pure data systems, the likelihood that a single bit error is critical is great and a retransmit request is sent back to the transmitting source, in accordance with step 265. If however, the accuracy of the uncorrectable data is not essential, as is the case with data messages of a synchronous nature (such as voice, audio, or video), then the corrupted and uncorrectable data is simply discarded and the next sequential data message is processed, in accordance with step 270.

Figure 3:
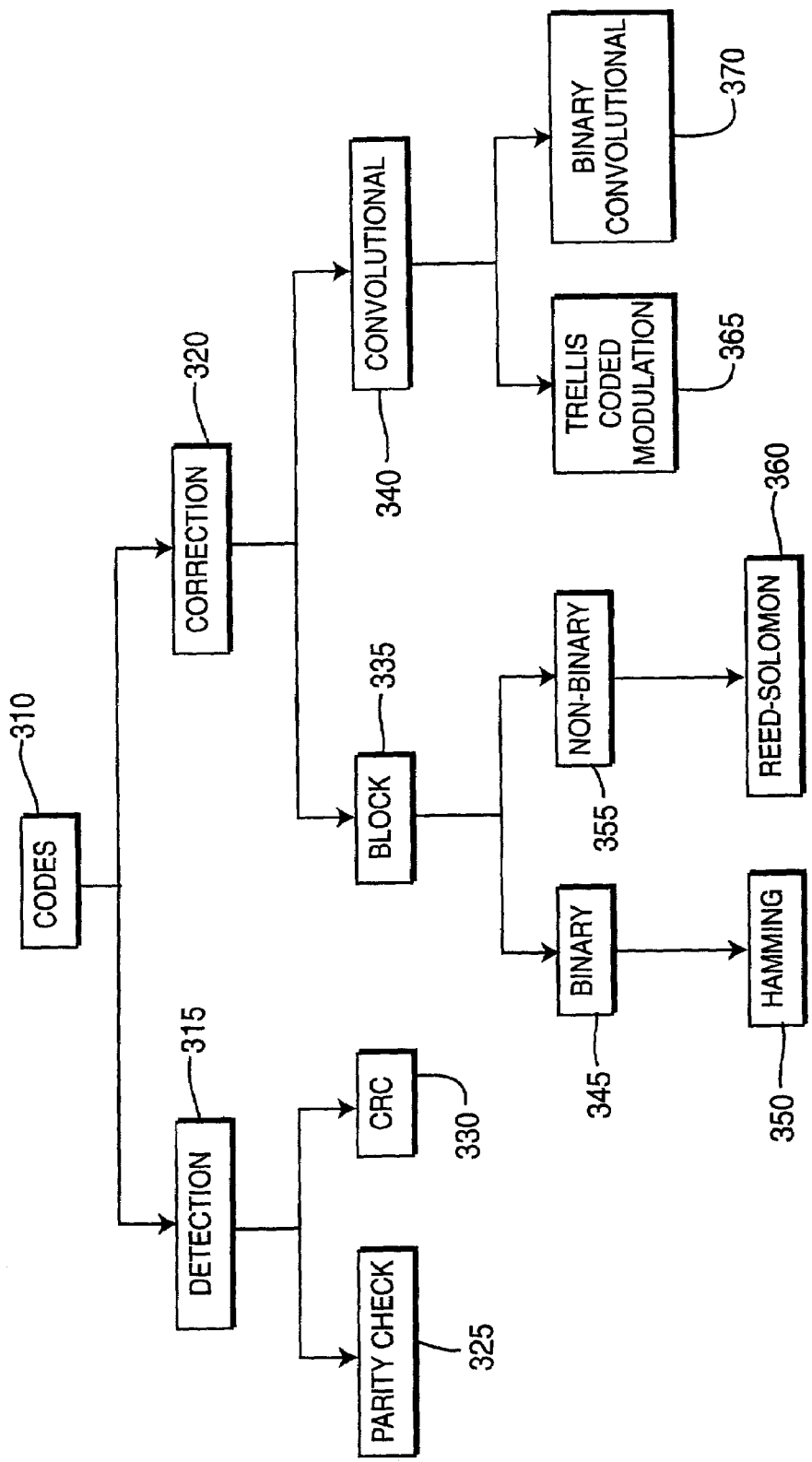
FIG. 3 is a hierarchical representation for various error correcting schemes.

With reference to FIG. 3, there is depicted a hierarchical representation for various error code classifications and schemes. Error codes 310 can be divided into two basic classifications: (i) automatic retransmission request (ARQ) or detection codes 315, and (ii) forward error correction (FEC) codes 320. ARQ is a detection-only type of coding, where errors in a transmission can be detected by the receiver but not corrected. The receiver must ask for any data received and request that data received with detected errors be retransmitted. Since these retransmissions will steal valuable bandwidth, ARQ codes are generally used for "clean" transmission mediums (those with a lower probability of error). One of the most common examples is simple parity checking 325, which is often used to detect data errors in RAM. Another example is a cyclic redundancy check (CRC) 330, which is used to detect errors in a transmission over Ethernet, for example. If errors are detected, the message will be retransmitted. Since Ethernet is primarily transmitted over wire, the chance for errors is less than for some other mediums. CRC and ARQ are merely two illustrative examples of error detection code schemes; and other error detection code schemes are known to those skilled in the art. Error codes that merely detect errors and do not correct them add significantly less redundancy than do error correction codes. Furthermore, an error detection decoder is much less complex than an error correction decoder. Systems utilizing error detection code schemes are generally bandwidth tolerant with respect to the overhead incurred for data retransmission. That is, data retransmission does not significantly affect overall system throughput.

Since a noisy medium stands a fair chance of introducing error into a given transmission, the use of ARQ methods means constant retransmission of data, reducing system throughput to unacceptable levels. In these cases, error correction code, as the name implies, allows not only detection of errors at the receiving end, but correction of errors as well. This reduces the need for data retransmission, which is then only required when the number of errors is greater than the number that can be corrected by the error correction method utilized. Error correction is also used for one-way communications, where the opportunity for the receiver to request that the sender retransmits is unavailable. Illustrative examples of these one-way paths include some satellite transmissions and magnetic tape storage mediums.

Error correction codes may be divided into two main subcategories. The first being block codes 335 and the second being convolutional codes 340. Block codes 335 are frequently used error correction codes that work with message blocks of a defined finite length. Block codes 335 are so named because the subcategory utilizes an encoder that processes a block of message symbols and then outputs a block of codeword symbols. Block codes can generally be classified into two types; binary codes 345 and non-binary codes 355. One example of a binary code 345 is the Hamming code 350, characterized by having four information bits and three check bits per character. An example of a non-binary code is the Reed-Solomon code 360.

In contrast, convolutional code 340 encoders work on a continuous stream of message symbols and simultaneously generate a continuous encoded output stream. These codes get their name because the encoding process can be viewed as the convolution of the message symbols and the impulse response of the encoder. Two examples of convolutional codes 340 are Trellis coded modulation (TCM) 365 and binary convolutional coding 370.

Figure 4:
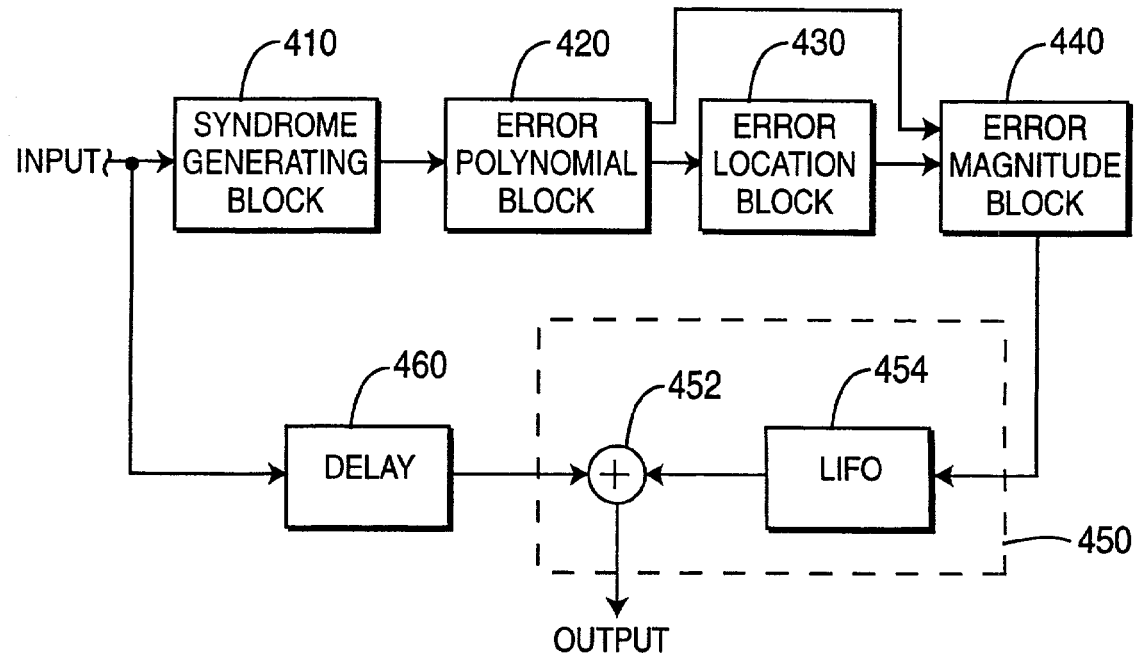
FIG. 4 is a block diagram representation of a Reed-Solomon (RS) decoder.

FIG. 4 is a block diagram representation of an exemplary Reed-Solomon (RS) decoder. As previously described, Reed-Solomon codes are non-binary systematic cyclic linear block codes. Non-binary codes work with symbols that are comprised of several bits. A common symbol size for non-binary codes is 8 bits, or a byte. Non-binary code, such as the Reed-Solomon code, are good at correcting burst errors because the correction of these codes is done on the symbol level. By working with symbols in the decoding process, these codes can correct a symbol with a burst of 8 errors just as easily as they can correct a symbol with a single bit error. A systematic code, such as the Reed-Solomon code, generates codewords that contain the message symbols in unaltered form. The encoder applies a reversible mathematical function to the message symbols in order to generate the redundancy, or parity, symbols. The codeword is then formed by appending the parity symbols to the message symbols. The Reed-Solomon code is considered a cyclical code because a circular shift of any valid codeword also produces another valid codeword. Cyclic codes are popular because there exist efficient and inexpensive decoding techniques to implement them. Finally, the Reed-Solomon code is considered linear because the addition of any two valid codewords results in another valid codeword.

The theory of error control codes utilizes a mathematical construct known as finite fields or Galois fields. A Galois field is a set that contains a finite number of elements. The operations of addition and multiplication on this set are defined and the operations behave as would be expected from normal arithmetic. For example, the additive identity element is 0 and the multiplicative identity element is 1. Reed-Solomon code is implemented utilizing Galois field mathematics, which is responsible for the cyclical and linear nature of the code, and operates on Galois fields of order $q=p^m$ where p is a prime positive integer and m is a positive integer. A Galois field of order q is denoted by GF(q) and it contains q distinct elements.

A given Reed-Solomon code is indicated by referring to it as an (n,k) code. The parameter n indicates the codeword length in terms of the number of symbols in the codeword. The parameter k indicates the number of message symbols in the codeword. The number of parity symbols added is thus n−k. The error correcting capability of the code is $t=(n-k)/2$. The code can detect and correct T errors where $0 \leq T \leq t$. The codeword is based upon the message symbols and is generated with a Reed-Solomon encoder. Since Reed-Solomon is a systematic code, the n message symbols are transmitted as is and the n−k parity symbols are appended to the message symbols to form the codeword. The values of the parity symbols, which add redundancy to the transmitted codeword, depend upon the message symbols. This redundancy is exploited by the receiver's decoder to detect and correct errors.

At the receiver's decoder, codewords are received as input to the syndrome generating block 410. The first step performed by the decoder is syndrome calculation, performed by the syndrome generating block 410 (also frequently referred to as the syndrome generating module, or simply the syndrome generator). The syndrome is comprised of n−k symbols and the values are computed from the received codeword. The syndrome depends upon the error vector only, it is independent from the transmitted codeword. That is to say, each error vector has a unique syndrome vector, but many different received codewords will have the same syndrome if their error pattern is the same. The reason the syndrome is first calculated is because doing so narrows the search field for the error vector. First knowing the syndrome will narrow the number of proper error vectors to $2^{n-k}$ error vectors out of $2^n$ total possible error vectors.

One method by which the syndrome generating block 410 calculates the syndrome is by dividing the received codeword by the generator polynomial using Galois field algebra. The remainder of this division is called the syndrome polynomial s(x). The actual syndrome vector S(x) is computed by evaluating s(x) at $\alpha$ through $\alpha^{n-k}$. However, this method may not be optimally efficient from a hardware perspective, and an alternative method that is frequently used in hardware is to directly evaluate the received codeword R(x) at α through $\alpha^{n-k}$. The syndrome generating block 410 computes the syndrome S by evaluating the received codeword R at α through $\alpha^{n-k}$, that is, R(α) through R($\alpha^{n-k}$). In the Reed-Solomon code, n−k=2t, and thus there are 2t syndrome values to compute: [S1 S2 S3 . . . S(2t)]. These values are typically computed in parallel, the first syndrome generator evaluates the received codeword at α to form S1, the next syndrome generator evaluates the received codeword at $\alpha^2$ to form S2, and so on.

Once the syndrome is calculated by the syndrome generating block 410, its value is passed onto the error polynomial block 420. There, the syndrome is utilized to create an error location polynomial. This process involves solving simultaneous equations of t unknowns. Several fast algorithms are available for these calculations, including Berlekamp-Massey algorithm or Euclid's algorithm. These algorithms take advantage of the special matrix structure of Reed-Solomon codes and greatly reduce the computational effort required.

The error polynomial block 420 passes the error location polynomial (once determined) to the error location block 430 and the error magnitude block 440. The error location block 430 solves for the roots of the error location polynomial to determine error location. Typically, this is accomplished utilizing a Chien search algorithm, or Chien cell. Error locations determined by the error location block 430 are passed to the error magnitude block 440, along with the previously determined error location polynomial. The error magnitude block 440 determines the error magnitude by solving simultaneous equations with t unknowns. A fast and widely used algorithm used in implementing the error magnitude block 440 is the Forney algorithm.

The calculated error location and error magnitude are forwarded to the error correcting block 450 for recovering a corrected codeword, should it be corrupted. Often, the combination of error location and error magnitude is referred to as an error vector. The error vector is the same size as the codeword and contains non-zero values in locations that correspond to errors. All other locations contain zeros. Another input to the error correcting block 450 is the output of a delay block 460. The delay block 460 takes the received codeword and outputs the same received codeword, with delay. The error correcting block 450, in one embodiment, is implemented using a Galois field adder 452 along with a LIFO (Last In, First Out) block 454. The errors in the received codeword are corrected by adding the received codeword to the error vector using the Galois field adder 452. A LIFO block 454 is utilized because the error vector is generated in the reverse order of the received codeword, and therefore a LIFO operation must be applied to either the received codeword or the error vector in order to match the order of the bytes up in both vectors. The output of the error correcting block 450 is the decoder's estimate of the original codeword.

Figure 5:
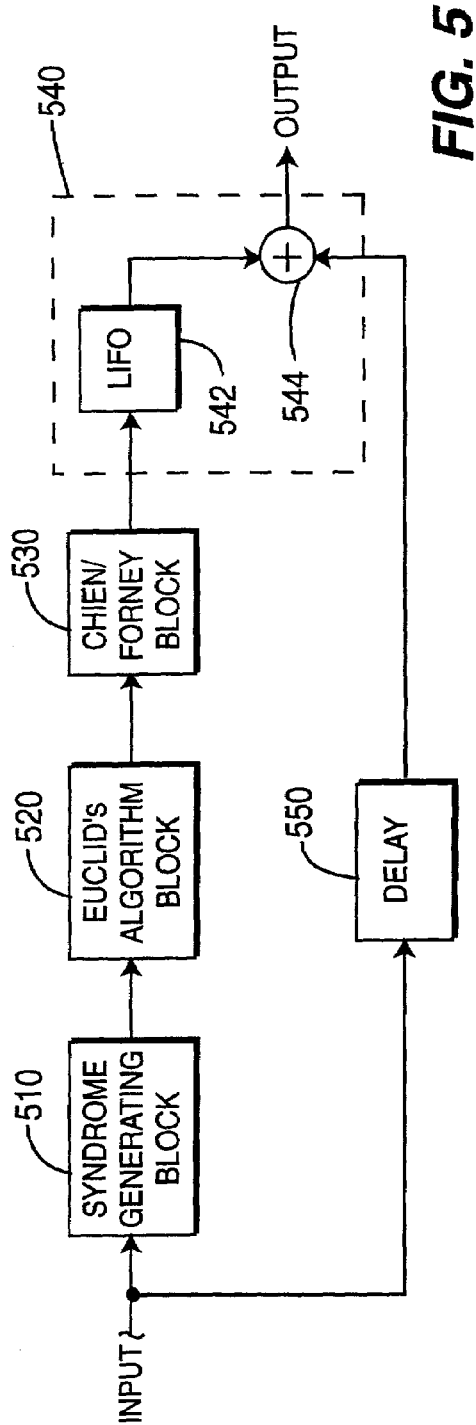
FIG. 5 is a block diagram representation for an exemplary embodiment of a Reed-Solomon (RS) decoder, as used in accordance with the principles of the present invention.

FIG. 5 is a block diagram representation for an exemplary embodiment of a Reed-Solomon (RS) decoder. The input is a received codeword which is forwarded to the syndrome generating block 510. Once the syndrome S(x) is calculated by the syndrome generating block 510, its value is passed onto the Euclid's algorithm block 520. Euclid's algorithm processes the syndrome S(x) in order to generate the error location polynomial Λ(x) and the error magnitude polynomial Ω(x). That is, it solves the following equation that is referred to as the Key Equation:

$$\Lambda(x)[1+S(x)]=\Omega(x) \bmod x^{2t+1} \quad \text{Eq. 1}$$

The algorithm used in Reed-Solomon decoding is based on Euclid's algorithm for finding the greatest common devisor (GCD) of two polynomials. Euclid's algorithm is a well-known iterative polynomial division algorithm.

Once the error location polynomial Λ(x) has been computed, it needs to be evaluated to find its roots. The Chien search algorithm is used to find these roots. The Chien search is a brute force algorithm that evaluates the polynomial for all possible input values, and then determines which outputs are equal to zero. If an error occurs in position i, then the following equation equals zero:

$$\sum_{j=0}^{t} \Lambda_j \alpha^{-ij} = 0, \text{where } i = 0 \ldots (n-1) \quad \text{Eq. 2}$$

The Chien search evaluates equation 2 for all the values of i and j and counts the number of times that the equation is equal to zero. The location of the zeros are the error locations, and the number of zeros is the number of symbols in error.

In an exemplary embodiment, there are (t+1) stages of the Chien search that are implemented in hardware. Each of these stages (where a stage is comprised of a multiplier, a multiplexer and a register) represents a different value for j in the above Chien search equation. The search is run for n clock cycles (each clock cycle represents a different value of i in the above equation) and the output of the adder is examined to see if it is equal to zero. If it is equal to zero, a zero detect block will output a 1, otherwise, it will output a zero. The output of the Chien search block is thus a string of n bits that have values of either '0' or '1'. Each '1' represents the location of a symbol in error.

For the first clock cycle the multiplexer will route the error location polynomial coefficient into the register. For the remaining (n−1) clock cycles, the output of the multiplier will be routed via the multiplexer into the register. The exponents of the multipliers have negative values. However, these values can be precomputed using a modulo operator. The exponent of $\alpha^{-i}$ is equal to (−i modulo n)=(−i modulo 255). For example, $\alpha^{-1}$ equals $\alpha^{254}$, $\alpha^{-2}$ equals $\alpha^{253}$, and so on.

The Forney algorithm is used to compute the error values $Y_i$. In order to compute these values, the Forney algorithm uses the error location polynomial Λ(x) and the error magnitude polynomial Ω(x). The equation for the error values is $$Y_i = \frac{\Omega(x)}{\Lambda'(x)} \text{ for } x = \alpha^{-i} \text{ where } \alpha^{-i} \text{ is a root of } \Lambda(x) \quad \text{Eq. 3}$$

The computation of the formal derivative Λ'(x) is actually quite simple. For example, assume Λ(x)=$\alpha^4 X^3 + \alpha^3 X^2 + \alpha X + \alpha^2$. Λ'(x) thus equals $$\begin{aligned}\Lambda'(x) &= 3\alpha^4 X^2 + 2\alpha^3 X + \alpha \\ &= (\alpha^4 + \alpha^4 + \alpha^4)X^2 + (\alpha^3 + \alpha^3)X + \alpha \\ &= \alpha^4 X^2 + \alpha \end{aligned} \quad \text{Eq. 4}$$

The derivative is formed by taking the coefficients of the odd powers of X, and assigning them to the next lower power of X (which will be even).

The Ω(x) polynomial is then evaluated along with the Λ'(x) polynomial using the same type of hardware as used for the Chien search. To evaluate Ω(x), the $\Omega_0$ coefficient would be added with the $\Omega_1$ coefficient times $\alpha^{-1}$, the $\Omega_2$ coefficient times $\alpha^{-2}$, and so on up to the $\Omega_t$ coefficient times $\alpha^{-t}$. The output of these multipliers is then summed.

The numerator is then multiplied by the denominator using an inverse multiply. The inverse multiply contains a lookup table that finds the inverse of the denominator. For example, if the denominator was $\alpha^3$, the inverse is $\alpha^{-3}$. This can then be expressed as $$\alpha^{-i} = \alpha^{(-i \bmod n)} = \alpha^{(-3 \bmod 255)} = \alpha^{252}.$$  Eq. 5

Since the same type of hardware is needed for both the Chien search and the Forney algorithm, the two functions can be combined in the same block, shown as the Chien/Forney block 530. In this implementation, two adders are used at the output of the Chien search. The first adder sums up the values for the even stages, and the other adder sums up the values for the odd stages. To form the final Chien search output, the outputs of these two adders are then summed and the zero detect block detects the locations of the roots. The output of the adder for the odd stages is also used in the Forney algorithm. The sum of the odd stages represents the denominator of the Forney equation. This summed value is inverted and then multiplied by the numerator value that is formed from evaluating the error magnitude polynomial. The output is AND'ed with the zero detect output since the error values are only valid for the actual error locations (and they should be set to zero otherwise).

Thus, the Chien/Forney block 530 uses the error location polynomial and the error magnitude polynomial to generate an error vector, which is forwarded to the error correcting block 540. The error vector is the same size as the codeword and contains non-zero values in locations that correspond to errors. All other locations contain zeros. Another input to the error correcting block 540 is the output of a delay block 550. The delay block 550 takes the received codeword and outputs the same received codeword, with delay. In the instant embodiment, the error correcting block 540 is implemented using a Galois field adder 544 along with a LIFO block 542. The errors in the received codeword are corrected by adding the received codeword to the error vector using the Galois field adder 544. A LIFO block 542 is utilized because the error vector is generated in the reverse order of the received codeword, and therefore a LIFO operation must be applied to either the received codeword or the error vector in order to synchronize the order of the bytes for both vectors. The output of the error correcting block 540 is the decoder's estimate of the original codeword.

Intra-Decoder Component Block Messaging

As previously described, a Reed-Solomon decoder has at least four main components, or functional blocks. They are the syndrome generator, the error polynomial block, the error location block, and error magnitude block. If the decoder corrects errors in addition to detecting them, then the decoder also includes an error correcting block. In prior art decoders, these blocks form a "delivery pipeline" in that the input to one block only depends on the output of a previous block. That is, there is no feedback from one block to a previous block. A Reed-Solomon decoder also requires the implementation of a memory or buffer block to store the received codeword while the decoding process is performed for a specific codeword (indicated by the delay block of FIGS. 4 and 5). Error location/magnitude blocks produce an error vector at the completion of the decoding process and this error vector is XORed with the received codeword that is stored in memory in order to form the decoder output. Typically, the size of the memory that is used is equal to one codeword and thus the decoder can only process a single codeword at a time.

Figure 6:
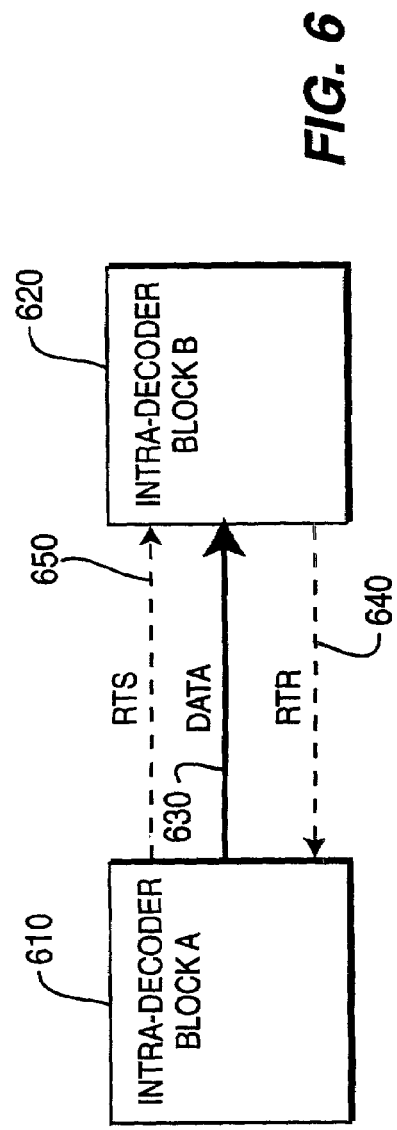
FIG. 6 is a block diagram illustrating an exemplary intra-decoder handshaking protocol, in accordance with the principles of the present invention.

FIG. 6 is a block diagram illustrating an exemplary embodiment of an internal decoder handshaking protocol, in accordance with the principles of the present invention. Intra-decoder block A 610 and intra-decoder block B 620 represent any two blocks within a Reed-Solomon decoder (selected from the functional blocks described above) which utilize feedback or communication between blocks. The decoding "delivery pipeline" is data channel 630, which is representative of any prior art unidirectional channel between functional blocks of a Reed-Solomon decoder. Additionally and in accordance with the present invention, feedback channels are also shown. The feedback channels may be thought of as means for one functional block to convey its present or future inactivity to an upstream or downstream functional block. For example, assume intra-decoder block A 610 has completed its processing function for a specific codeword. Intra-decoder block A 610 launches an inactivity message to intra-decoder block B 620 indicating that it is ready to forward the result of its computational function for a specified codeword to intra-decoder block B 620. Thus, this type of inactivity message is called a "Ready-To-Send" (RTS) message 650. Conversely, assume intra-decoder block B 620 has completed its processing function for a specific codeword. Intra-decoder block B 620 launches an inactivity message to intra-decoder block A 610 indicating that it is ready to receive. Thus, this type of inactivity message is called a "Ready-To-Receive" (RTR) message 640.

This embodiment of the present invention, a decoder implementation with feedback or handshaking between functional blocks is advantageous in that it enables a user-configurable architecture suitable for an Intellectual Property (IP) core that allows the user to customize the performance of the decoder based on the size of the memory that he wishes to use to implement it.

Figure 7:
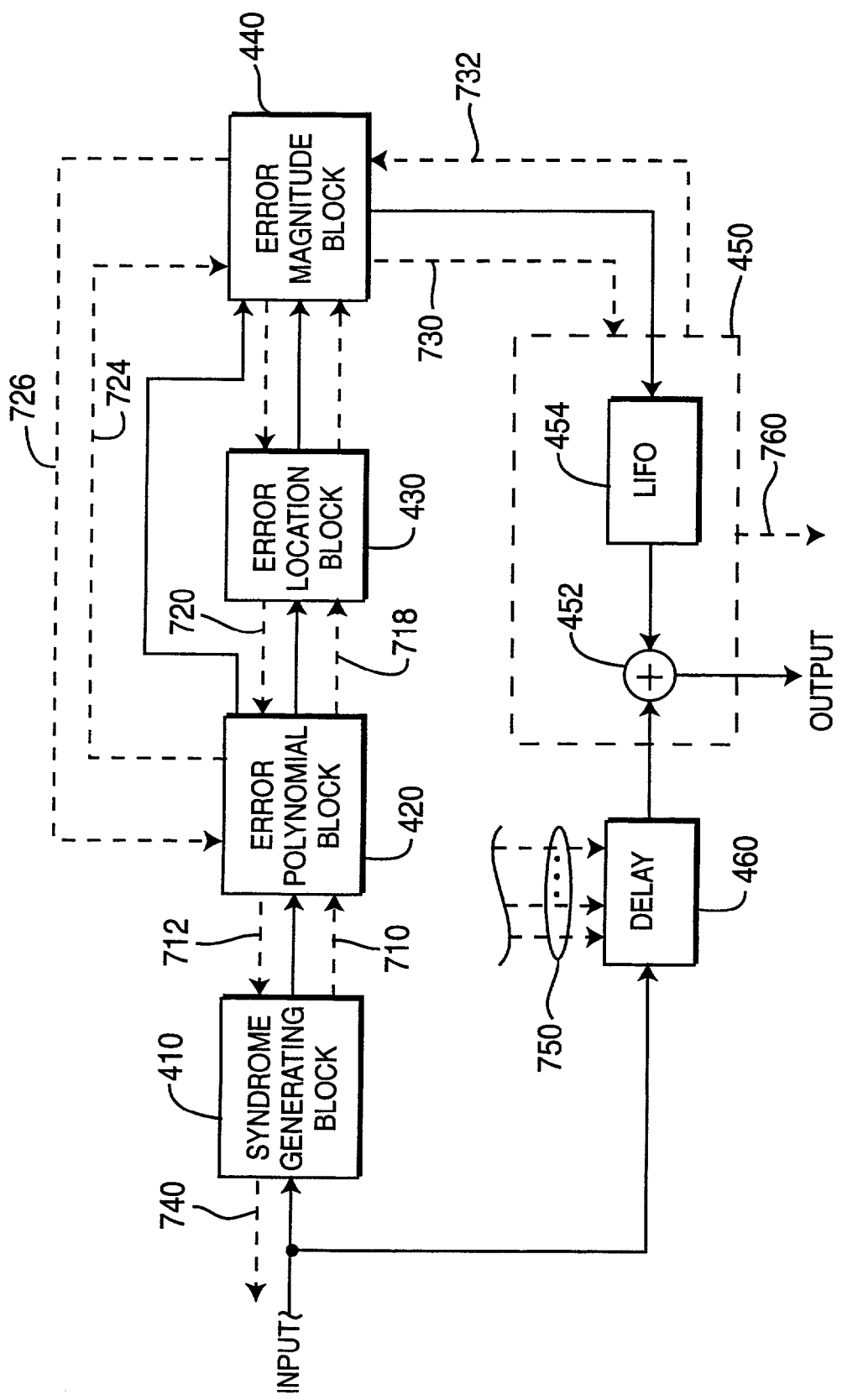
FIG. 7 is a block diagram illustrating a handshaking protocol between functional blocks of an exemplary embodiment of a Reed-Solomon (RS) decoder, in accordance with the principles of the present invention.

FIG. 7 is a block diagram illustrating a handshaking protocol between functional blocks of an exemplary embodiment of a Reed-Solomon (RS) decoder. The function, purpose, and operation of syndrome generating block 410, error polynomial block 420, error location block 430, error magnitude block 440, error correcting block 450 (including Galois field adder 452 and LIFO block 454), and delay block 460 are sufficiently described with respect to FIG. 4 and therefore not repeated here. Newly included in FIG. 7, the aforementioned inactivity messages (or handshaking signals) are shown. The handshaking signals (e.g., RTS and RTR messages) are used by the processing blocks to indicate when they have data to send and/or when they are ready to receive data. Therefore, syndrome generating block 410 and error polynomial block 420 are able to exchange an RTS message via an RTS channel 710 or an RTR message via an RTR channel 712. Error polynomial block 420 and error location block 430 are able to exchange an RTS message via an RTS channel 718 or an RTR message via an RTR channel 720. Error polynomial block 420 and error magnitude block 440 are able to exchange an RTS message via an RTS channel 724 or an RTR message via an RTR channel 726. Error magnitude block 420 and error correcting block 450 are able to exchange an RTS message via an RTS channel 724 or an RTR message via an RTR channel 726.

Syndrome generating block 410 is also adapted to request the next received codeword by sending an RTR message via an RTR channel 740. Error correcting block 450 is also adapted to send an RTS message to the output processing stages via RTS channel 760. Additionally, depending upon the implementation of the present invention chosen, it may be necessary to send any RTR or RTS message to the delay block 460 (via message channels 750), for the purpose of adjusting the delay appropriately so that the received codeword being checked and corrected is properly synchronized with the error vector at the error correcting block 450.

The advantageous utility derived from the present invention is that by enabling handshaking between intra-decoder functional blocks, a functional block is able to request receipt of more data to process when it becomes inactive (that is, it completes its last procedure). Similarly, a functional block is able to signal a downstream functional block that it has completed its procedure and can forward the result whenever the downstream functional block is able to receive that result. For example, although typically a syndrome generating block 410 will utilize a fixed (and known) number of clock cycles to generate a syndrome for a received codeword of a particular length, the error polynomial block 420 is an iterative process whose execution time can vary. In addition, typically the error location block 430 and error magnitude block 440 will take a fixed and (and known) number of clock cycles, but if it is determined that too many errors exist within a codeword such that it is uncorrectable, further processing may be aborted with respect to that codeword, and the error location block 430 and error magnitude block 440 can request to begin work on the next codeword by sending an RTR message to the error polynomial block 420 via the appropriate RTR channels 720,726. Therefore, error location block 430 and error magnitude block 440 can also take a variable number of clock cycles to complete.

It should be noted that the embodiment of the present invention shown in FIG. 7 is but one of several embodiments which may be implemented without deviating from the spirit and scope of the invention. For example, it is not required that each of the functional blocks of the decoder are equipped to send RTS and RTR messages. Rather, as a matter of design choice, it may be desirable to enable handshaking between the syndrome generating block 410 and the error polynomial block 420 only. A number of other variations are also possible. Furthermore, although RTS and RTR messages are illustrated and described as being communicated over RTS and RTR channels, such a description is merely a logical description, and the messaging channels may be incorporated over one common physical layer messaging channel separate from the data channel, or alternatively, the messaging channels may be incorporated over the same physical layer as the data channel itself.

In accordance with the principles of the present invention, a user can customize the performance of the decoder by changing the memory allocation size. Therefore, an embodiment with allocated memory size equal to the length of one codeword will have a hardware and power-efficient design, but it will only be able to process one codeword at a time. An embodiment with allocated memory size that is larger than one codeword length can process one codeword while starting to load a second codeword. An embodiment with allocated memory the size of two codewords will enable two codewords to be processed simultaneously, and so on. Of course, increasing the size of incorporated memory correspondingly leads to more expense in terms of hardware and power, but the benefit is a corresponding increase in the speed of the decoding process and a decrease in latency, since a greater number of codewords can be processed in a given amount of time. The handshaking signals completely automate the process so that the user only needs to input the memory size utilized by the decoder. By controlling this single parameter, the user can customize the performance of the decoder in terms of speed, power and size (gate count).

Figure 8:
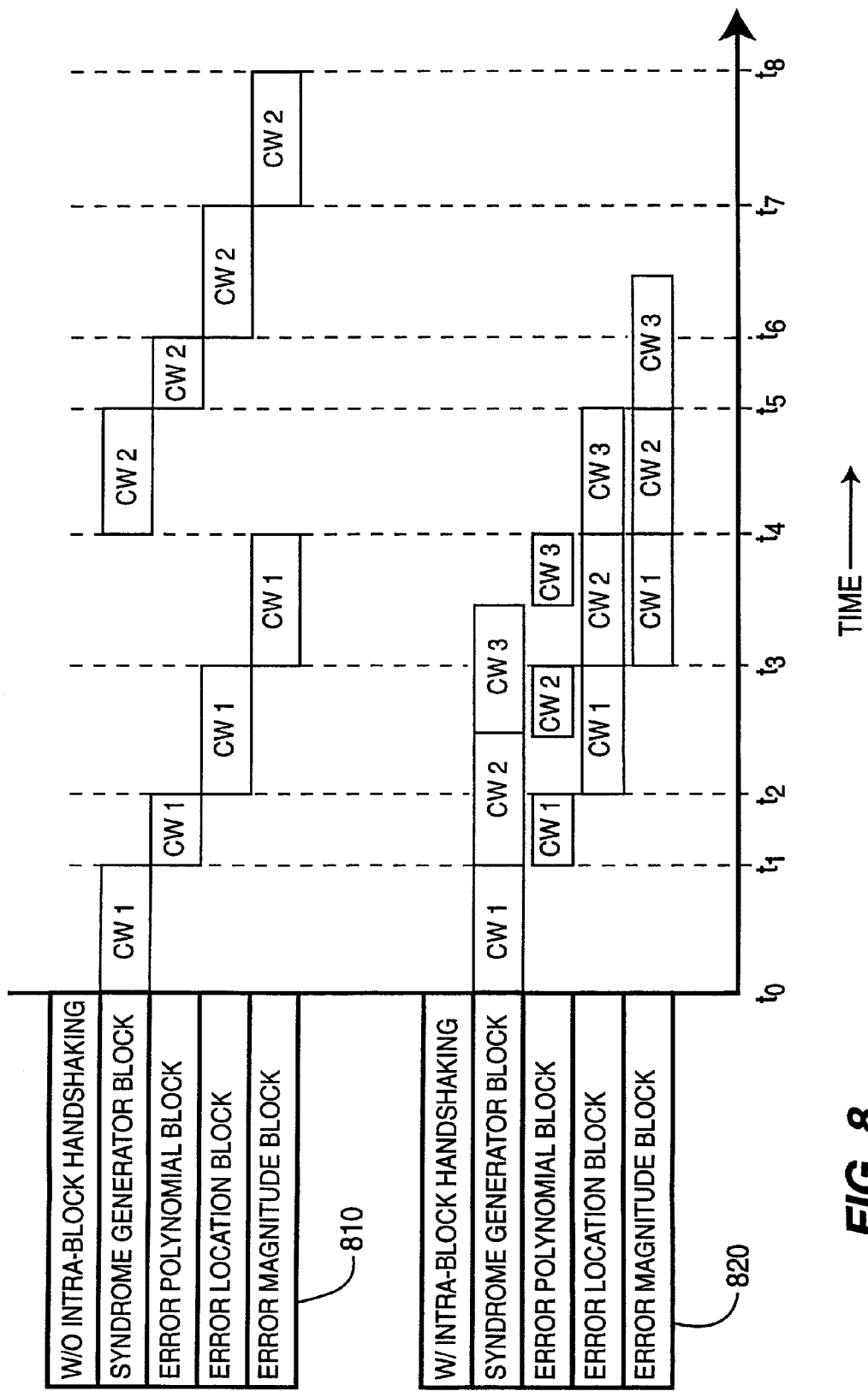
FIG. 8 is a timing diagram for exemplary Reed-Solomon (RS) decoders, demonstrating the efficiencies associated with a decoder using intra-block handshaking, in accordance with the principles of the present invention.

FIG. 8 is a timing diagram for exemplary Reed-Solomon (RS) decoders, demonstrating the efficiencies associated with a decoder using intra-block handshaking, in accordance with the principles of the present invention. The upper portion of the timing diagram 810 illustrates the time required for processing in a typical decoder without intra-block handshaking. Under this scheme, the processing of codeword 1 (CW1) begins at time $t_0$. The CW1 syndrome is generated at time $t_1$ and the result is passed to the error polynomial block. The error polynomial block completes processing CW1 at time $t_2$, and so on until CW1 is completely processed at time $t_4$. The processing of codeword 2 (CW2) therefore begins at time $t_4$. This single-function sequential-processing continues for CW2 until at time $t_8$ the error location and error magnitude calculations for CW2 are complete. Note that it takes a total of $(t_8-t_0)$ units of time to process two codewords without intra-block handshaking.

The lower portion of the timing diagram 820 illustrates the processing times in a decoder with intra-block handshaking. Note that by implementing a memory large enough for three codewords, the decoder can simultaneously process three codewords at a time. This efficiency is achieved since each block is able to receive more data the moment it finishes processing because it informs the previous block that it is ready. In this illustrative example, the processing of codeword 3 (CW3) is completed sometime between time $t_6$ and $t_7$.

Dual Chien Search Blocks in an Error-Correcting Decoder

One exemplary embodiment of the present invention uses dual Chien search blocks to implement the error correction process. A decoder utilizing the principles of this embodiment of the present invention reduces both the decoder latency and the decoder storage/memory requirements.

Figure 9:
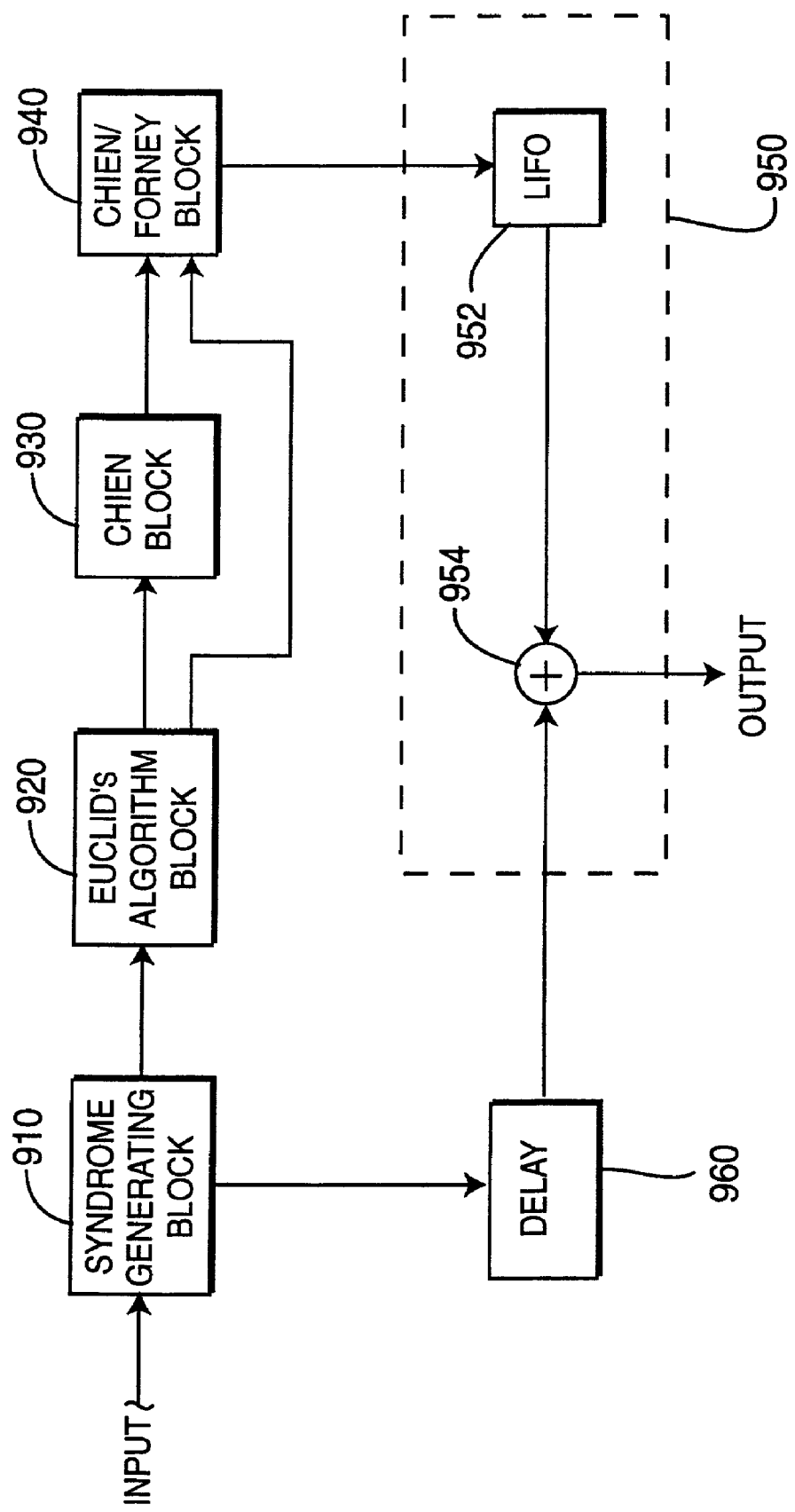
FIG. 9 is a block diagram representation for an exemplary embodiment of a Reed-Solomon (RS) decoder utilizing a Chien block in addition to a Chien/Forney block, in accordance with the principles of the present invention.

FIG. 9 is a block diagram representation for an exemplary embodiment of a Reed-Solomon (RS) decoder utilizing dual Chien search blocks, in accordance with the principles of the present invention. The input is a received codeword, which is forwarded to the syndrome generating block 910. Once the syndrome S(x) is calculated by the syndrome generating block 910, the syndrome is forwarded to Euclid's algorithm block 920. Euclid's algorithm is used to process the syndrome S(x) in order to generate the error location polynomial Λ(x) and the error magnitude polynomial Ω(x).

In the instant embodiment of the present invention, a new Chien block 930 is incorporated for determining the number of errors in a codeword. Once the error location polynomial Λ(x) has been computed, Chien block 930 applies the Chien search algorithm to evaluate the roots. The Chien search is a brute force algorithm that evaluates the polynomial for all possible input values, and then determines which outputs are equal to zero. If an error occurs in position i, then the following equation equals zero:

$$\sum_{j=0}^{t} \Lambda_j \alpha^{-ij} = 0, \text{where } i = 0 \ldots (n-1) \qquad \text{Eq. 6}$$

The Chien block 930 evaluates the above equation for all the values of i and j and counts the number of times that the equation is equal to zero. The resulting number is the number of errors detected.

As previously described, the error polynomial must be evaluated both for error location and error magnitude. Since the same type of hardware is needed to implement both the Chien search and the Forney algorithms, the two functions can be combined in the same block, shown as the Chien/Forney block 940. In this implementation, two adders are used at the output of the Chien search. The first adder sums up the values for the even stages, and the other adder sums up the values for the odd stages. To form the final Chien search output, the outputs of these two adders are then summed and the zero detect block detects the locations of the roots. The output of the adder for the odd stages is also used in the Forney algorithm. The sum of the odd stages represents the denominator of the Forney equation. This summed value is inverted and then multiplied by the numerator value that is formed from evaluating the error magnitude polynomial. The output is AND'ed with the zero detect output since the error values are only valid for the actual error locations (and they should be set to zero otherwise).

Thus, the Chien/Forney block 940 uses the error location polynomial and the error magnitude polynomial to generate an error vector, which is forwarded to the error correcting block 950. The error vector is the same size as the codeword and contains non-zero values in locations that correspond to errors. All other locations contain zeros. Another input to the error correcting block 950 is the output of a delay block 960. The delay block 960 takes the received codeword and outputs the same received codeword, with delay. In the instant embodiment, the error correcting block 950 is implemented using a Galois field adder 954 along with a LIFO block 952. The errors in the received codeword are corrected by adding the received codeword to the error vector using the Galois field adder 954. A LIFO block 952 is utilized because the error vector is generated in the reverse order of the received codeword, and therefore a LIFO operation must be applied to either the received codeword or the error vector in order to match the order of the bytes up in both vectors. The output of the error correcting block 950 is the decoder's estimate of the original codeword.

A Reed-Solomon decoder can only correct up to t errors, where the number of parity bytes included is 2t. If greater than t errors are detected, it generally is desirable to forward the received codeword to the decoder output, unaltered and uncorrected, since the codeword is uncorrectable if greater than t errors are detected. In prior art Chien/Forney implementations, an entire codeword must be processed before the number of errors can be determined. Thus, the operation takes N clock cycles where N is the length of the codeword. Once the Chien/Forney computation is completed, the number of errors is determined and compared to the value of t. If the number of errors is less than or equal to t, the error values from the Chien/Forney block are subjected to an "Exclusive OR" (XOR) operation with the received codeword to perform error correction, thus generating the final decoder output. However, if the number of errors is greater than t, the received codeword is forwarded unaltered as the decoder output. Thus, the prior art method requires the entire received codeword to be stored until the completion of processing by the Chien/Forney block. Such a scheme also introduces a latency delay because the decoder output can't be forwarded until the entire N clock cycles of the block are completed.

In contrast, the instant embodiment of the present invention subjects codewords to the Chien algorithm twice; the first time to determine the number of errors, and the second time to determine error location. Thus, when Chien block 930 detects that the number of errors is greater than the threshold value t, the received codeword is passed on as the decoder output and the memory is freed. Conversely, when the number of errors is less than or equal to the threshold value t, the data is passed on to the Chien/Forney block in order to determine the actual error locations and magnitudes. Such an implementation would be optimized when utilized in conjunction with the handshaking embodiment of the present invention shown in FIGS. 6–8. Such a combination enables the Chien/Forney block 940 to compute errors concurrently while the Chien block 930 is determining the number of errors for the next codeword. Thus, the output of the Chien/Forney block 940 can be immediately sent out and the corresponding memory freed.

Enhanced Chien Search Cell for an Error Correcting Decoder

As previously described, the Chien/Forney block receives two polynomials as inputs; the error location and error magnitude polynomials; and generates an error vector as an output. The error vector is a vector of N bytes that represent the decoder's estimate of the errors in a received codeword. The error vector is subjected to an exclusive OR (XOR) operation with the received codeword in order to correct errors to form the decoder's estimate of the original codeword. Prior art decoders using a Chien/Forney block to determine the error vector produce the error vector in reverse order with respect to the codeword vector. That is, the codeword and the error vector cannot undergo the XOR operation without the error vector (or conversely, the codeword) being subjected to further processing. Typically, this further processing takes the form of a LIFO (Last In, First Out) operation on either the error vector or the received codeword, the purpose being to reverse the order of the input so that the codeword and error vector can undergo the XOR operation. Unfortunately, this introduces a delay of N clock cycles where N is the number of bytes in a codeword. Additionally, some prior art implementations use a memory size greater than the length of a single codeword, thus requiring the memory to be broken down into two or more separate LIFO clocks. Doing so can cause addressing complications and also limits the memory size to an integral multiple of the codeword length.

One exemplary embodiment of the present invention is a new Chien search cell which produces an output in correct synchronization with respect to the codeword. That is, neither error vector nor the codeword vector requires reversal prior to being subjected to the XOR operation, thus eliminating the need for a LIFO block or other reversal means. Therefore, a shorter latency period is achieved since a delay of N clock cycles is not required. Furthermore, the instant embodiment of the present invention simplifies the addressing scheme (with respect to the prior art) and supports memory sizes other than merely integral multiples of the length of a codeword. For example, a memory two and one half times the length of a codeword may be used, which allows the decoder to process two codewords while a portion of the next codeword is being loaded.

Figure 10:
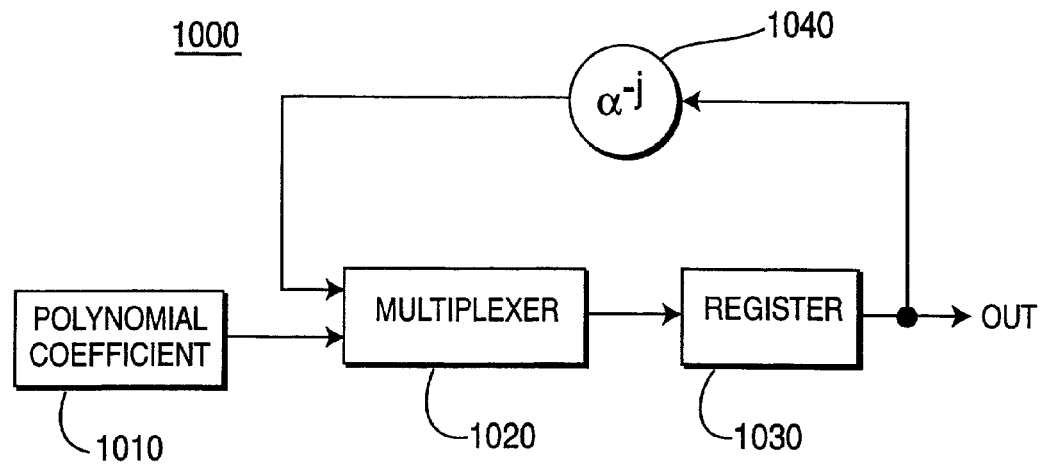
FIG. 10 is a block diagram representation for a typical prior art Chien search cell implemented in a Reed-Solomon (RS) decoder.

FIG. 10 is a block diagram representation for a typical prior art Chien search cell 1000, the basic building block for Chien search and Chien/Forney blocks. The Chien search block is used to evaluate the error location polynomial Λ, for the purpose of finding its roots. The locations of the roots correspond to the locations in the received codeword that are in error. The Chien search cell of FIG. 10 is used to implement the equation:

$$X_i = \sum_{j=0}^{t} \Lambda_j \alpha^{-ij}, \text{where } i = 0 \ldots (N-1) \quad \text{Eq. 7}$$

Calculation of equation 9 results in a null (zero) value for byte positions in the codeword that correspond to errors. The Chien search cell 1000 is the hardware architecture used to implement a single stage of the above equation. Each stage processes a single coefficient of the error location polynomial Λ, thus there are a total of (t+1) stages (since the error location polynomial can have a maximum degree of t and a polynomial of degree t has (t+1) coefficients).

The Chien search cell 1000 processes the error location polynomial coefficient in an iterative manner. On the first iteration, the multiplexer 1020 receives the appropriate polynomial coefficient 1010 corresponding to the codeword being processed and routes the polynomial coefficient to the register 1030. On subsequent clock cycles, the output of the register is first forwarded to multiplier 1040 where it is multiplied by $\alpha^{-j}$ and then routed by the multiplexer 1020 back to the register for storage. This process is performed for a total of N clock cycles. Referring back to equation 9, the index i indicates the iteration number and the index j indicates the Chien search cell stage. That is, the value of j increments from 0 to t and thus there are a total of (t+1) Chien search cell stages implemented in hardware.

As an illustrative example, assume that the cell represents the second stage (j=1). Thus, on each clock cycle, the register output will be multiplied by $\alpha^{-1}$ and the result is stored back in the register. This produces the following sequence:

$$\lambda + \lambda\alpha^{-1}X + (\lambda\alpha^{-1})\alpha^{-1}X^2 + ((\lambda\alpha^{-1})\alpha^{-1})\alpha^{-1}X^3 + \ldots$$

where $X^n$ represents a delay of n clock cycles:

By combining terms, the final sequence produces is:

$$\lambda + \lambda\alpha^{-1}X + \lambda\alpha^{-2}X^2 + \lambda\alpha^{-3}X^3 + \ldots + \lambda\alpha^{-(N-1)}X^{N-1}$$

The problem associated with this implementation is that the error locations are produced in the reverse order of the corresponding codeword bytes, and thus they need to be reversed by a LIFO block before being added to the codeword for correction. A LIFO block is a hardware storage element containing a plurality of registers. Once all the registers are filled, the LIFO block sends out its outputs. The last element at the input becomes the first element at the output, and so on. There are two problems with using a LIFO block. One is that it is a large storage/memory element and thus it increases the gate count and the power consumption of the IC. Another problem is that the LIFO block introduces a latency of N clock cycles. This latency occurs because it takes N clock cycles for the LIFO block to initially fill up, and no outputs can be generated until the last element is read into the LIFO.

Figure 11:
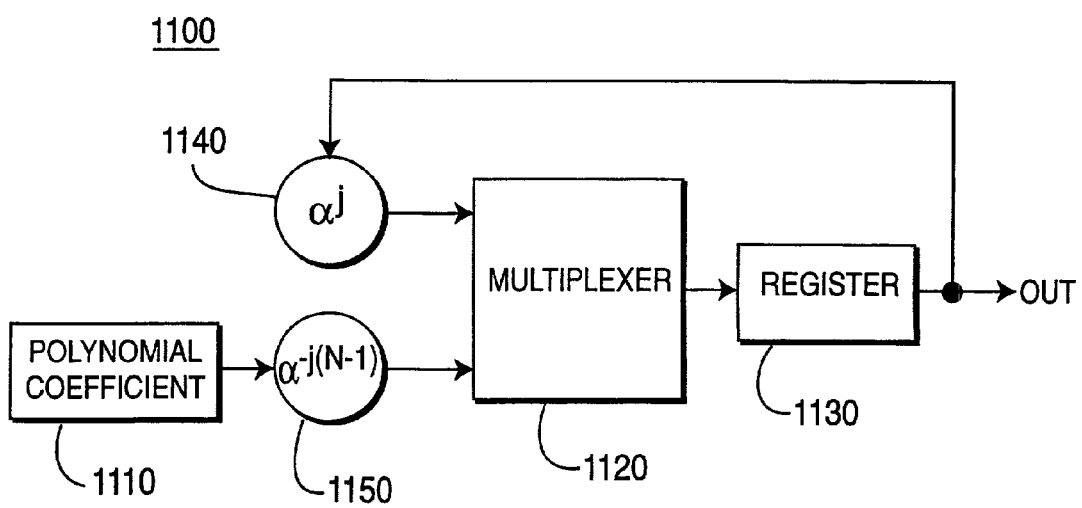
FIG. 11 is a block diagram representation for an improved Chien search cell implemented in a Reed-Solomon (RS)

FIG. 11 is a block diagram representation for an improved Chien search cell 1100, in which memory requirements and delay are both reduced, in accordance with the principles of the present invention. The underlying principle of the instant embodiment of the present invention is to enable the Chien search block to produce a sequence that is mathematically equivalent to that produced by the standard Chien search, albeit with coefficients generated in the opposite order (hereinafter referred to as the "normalized order"). The instant embodiment implements the following two equations (equations 10 and 11) used to generate error locations in a normalized order for codeword correction.

$$X_i = \sum_{j=0}^{t} \Lambda_j \alpha^{-j(N-1)} \text{ where } i = 0 \quad \text{Eq. 8}$$

$$X_i = \sum_{j=0}^{t} \Lambda_j \alpha^j \text{ where } i = 1 \ldots (N-1) \quad \text{Eq. 9}$$

Recall that the prior art Chien search cell 1000 of FIG. 10 processes the error location polynomial coefficient in an iterative manner, beginning with an alpha exponent of '0' which is decremented with each clock cycle until the exponent decreases to a value of –j(N–1). For the instant embodiment of the Chien search cell 1100 of FIG. 11, the value of the alpha exponent begins at a value of –j(N–1) and is incremented with each clock cycle until the exponent reaches 0.

Therefore, during the first clock cycle, the polynomial coefficient 1110 is multiplied by $\alpha^{-j(N-1)}$ (where j is the stage number) by premultiplier 1150, forwarded to the multiplexer 1120, and routed to the register 1130 for storage. On subsequent clock cycles, the output of the register 1130 is forwarded to multiplier 1140 where it is multiplied by $\alpha^j$ and then routed by the multiplexer 1120 back to the register.

As an illustrative example, assume that the cell represents the second stage (j=1). This produces the following sequence:

$$\lambda\alpha^{-(N-1)}X + (\lambda\alpha^{-(N-1)})\alpha X^2 + ((\lambda\alpha^{-(N-1)})\alpha)\alpha X^3 + \ldots$$

Combining terms produces the following sequence:

$$\lambda\alpha^{-(N-1)} + \lambda\alpha^{-(N-2)}X + \lambda\alpha^{-(N-3)}X^2 + \ldots + \lambda\alpha^{-1}X^{N-2} + \lambda X^{N-1}$$

It is to be noted that the coefficients generated in this sequence are identical to that produced by a standard Chien search cell 1000 of FIG. 10, except that they are now in reverse order (as denoted by the reverse order of the delay coefficients). The Chien search cell 1100 of FIG. 11 does utilize an extra Galois field multiplier (two instead of one), but they are small and inexpensive to implement in hardware. The advantage and utility that results from no longer requiring a LIFO block for reversal and from avoiding the delay required to fill the LIFO outweigh the disadvantage of supplying an extra Galois field multiplier for each Chien search cell.

It is a common design practice to combine the Chien search and Forney algorithm within a single block since both algorithms require the performance of similar functions. The principles of the instant embodiment of the present invention as illustrated and described in conjunction with FIG. 11 apply equally to the Forney block cells as well, since the Forney algorithm processes the error magnitude polynomial using very similar hardware. It would be known to those skilled in the art that the principles of the present invention may be extended to the design of Forney block cells and Chien/Forney block cells.

Many existing systems use "off-the-shelf" integrated circuits that encode and decode Reed-Solomon codes. These ICs tend to support a certain amount of programmability (for example, RS(255,k) where t=1 to 16 symbols). A recent trend is towards VHDL or Verilog designs (logic cores or intellectual property cores). These have a number of advantages over standard ICs. A logic core can be integrated with other VHDL or Verilog components and synthesized to an FPGA (Field Programmable Gate Array) or ASIC (Application Specific Integrated Circuit)—this enables so-called "System on Chip" designs where multiple modules can be combined in a single IC. Depending on production volumes, logic cores can often give significantly lower system costs than "standard" ICs.

Although the present invention is described in the context of a hardware implementation, the principles of the invention should not be construed as being so limited. Until recently, software implementations in "real-time" required too much computational power for all but the simplest of Reed-Solomon codes (i.e. codes with small values of t). The major difficulty in implementing Reed-Solomon codes in software is that general purpose processors do not support Galois field arithmetic operations. For example, to implement a Galois field multiply in software requires a test for 0, two log table look-ups, modulo add and anti-log table look-up. However, careful design together with increases in processor performance mean that software implementations can operate at relatively high data rates.

While this invention has been described in terms of exemplary embodiments and/or configurations, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. In a cyclic linear block code error correcting decoder having at least four blocks, said blocks including a syndrome generating block, an error polynomial block, an error location block, and an error magnitude block, a method for performing data error correction of a codeword, said method comprising the acts of:
    calculating a syndrome from said codeword in said syndrome generating block;
    generating an error polynomial from said syndrome in said error polynomial block;
    determining an error location from said error polynomial in said error location block; and
    calculating an error magnitude from said error polynomial in said error magnitude block,
    said method characterized in that at least one of said at least four blocks is capable of conveying an inactivity message to other ones of said at least four blocks.

2. The method of claim 1 further comprising the act of: correcting said codeword responsive to said error location and said error magnitude.

3. The method of claim 1 wherein said inactivity message is a ready-to-receive message.

4. The method of claim 1 wherein said inactivity message is a ready-to-send message.

5. The method of claim 1 wherein said error polynomial block is a Euclid's algorithm block.

6. The method of claim 1 wherein said error polynomial block is a Berlekamp-Massey algorithm block.

7. The method of claim 1 wherein said error location block is a Chien search block.

8. The method of claim 1 wherein said error magnitude block is a Forney algorithm block.

9. The method of claim 1 wherein the acts associated with said error location block and said error magnitude block are performed within a combined Chien/Forney block.

10. The method of claim 1 wherein said cyclic linear block code error correcting decoder is a Reed-Solomon decoder.

11. A decoder for performing data error detection within a codeword, said decoder comprising:
    means for calculating a syndrome from said codeword;
    means for generating an error polynomial from said syndrome;
    means for determining an error location from said error polynomial; and
    means for calculating an error magnitude from said error polynomial,
    said decoder characterized in that an intra-decoder inactivity message conveying capability is incorporated within at least one component selected from a group consisting of said means for calculating said syndrome, said means for generating said error polynomial, said means for determining said error location, and said means for calculating said error magnitude.

12. The decoder of claim 11 further comprising a means for correcting said codeword responsive to receipt of said codeword, said error location, and said error magnitude as inputs.

13. The decoder of claim 11 wherein said decoder is a Reed-Solomon decoder.

14. The decoder of claim 11 wherein said intra-decoder inactivity message is a ready-to-receive message.

15. The decoder of claim 11 wherein said intra-decoder inactivity message is a ready-to-send message.

16. The decoder of claim 11 wherein said means for generating an error polynomial is a Euclid's algorithm block.

17. The decoder of claim 11 wherein said means for generating an error location block is a Chien search block.

18. The decoder of claim 11 wherein said means for calculating an error magnitude is a Forney algorithm block.

19. A decoder for performing data error detection within a codeword, said decoder comprising:
    a syndrome generator for calculating a syndrome from said codeword;
    an error polynomial generator for generating an error polynomial from said syndrome;
    an error location generator for determining an error location from said error polynomial; and
    an error magnitude generator for calculating an error magnitude from said error polynomial,
    said decoder characterized in that an intra-decoder inactivity message convenying capability is incorporated within at least one component selected from a group consisting of said syndrome generator, said error polynomial generator, said error location generator, and said error magnitude generator.

20. The decoder of claim 19 further comprising an error corrected codeword generator for correcting said codeword responsive to receipt of said codeword, said error location, and said error magnitude as inputs.

* * * * *